United States Patent [19]

Howard et al.

[11] 4,342,924
[45] Aug. 3, 1982

[54] NONHYSTERETIC JOSEPHSON JUNCTION CIRCUITS WITH FEEDBACK

[75] Inventors: Richard E. Howard; Lawrence D. Jackel, both of Holmdel, N.J.

[73] Assignee: Bell Telephone Laboratories, Incorporated, Murray Hill, N.J.

[21] Appl. No.: 173,388

[22] Filed: Jul. 29, 1980

[51] Int. Cl.³ ............................................. H03K 17/92
[52] U.S. Cl. .................................. 307/245; 307/277; 307/306; 307/476
[58] Field of Search ............... 307/277, 306, 462, 476, 307/245; 357/5; 365/162

[56] References Cited

U.S. PATENT DOCUMENTS 3,725,819 4/1973 Fulton ............................. 331/107 S
4,117,354 9/1978 Geewala ............................. 307/277

OTHER PUBLICATIONS

D. L. Stuehm et al, "Three-Josephson-Junction Interferometer" Appl. Phys. Lett. vol. 20, No. 11 Jun. 1, 1972 pp. 456–458.

H. H. Zappe, "Josephson Quantum Interference Computer Devices" IEEE Transactions on Magnetics vol. MAG-13 No. 1 Jan., 1977, pp. 41–47.

J. Clarke et al., "Josephson-Junction Amplifier" Applied Physics Letters vol. 19, No. 11, Dec. 1, 1971 pp. 469–471.

*Primary Examiner*—John Zazworsky
*Attorney, Agent, or Firm*—Michael J. Urbano

[57] ABSTRACT

The transfer characteristic of nonhysteretic Josephson junction gates (G) is sharpened and desired switching behavior free from resetting requirements is achieved by a positive feedback scheme (FIGS. 5, 8–9) in which the gate is made to be responsive to current flow in the output line (20). Specific applications to three-junction interferometers (FIG. 5) are described as are various means for rendering the gate responsive to the output, i.e., magnetically coupling the output line to the gate (FIGS. 5, 8), adding a portion of the output current to the control line (FIG. 9), and injecting a portion of the output current directly into the gate (FIG. 10).

8 Claims, 10 Drawing Figures

NONHYSTERETIC JOSEPHSON JUNCTION CIRCUITS WITH FEEDBACK

BACKGROUND OF THE INVENTION

Josephson-like devices can be categorized by their current-voltage (I-V) characteristics as being either hysteretic or nonhysteretic. The former class includes the common three-layer superconductor-oxide-superconductor sandwich structure, whereas the latter includes weak-link microbridges, point contact devices, high current density oxide barrier junctions, and three-layer structures with semiconductor barrier layers (e.g., Si or Ge-Sn).

Josephson logic circuits are now made almost exclusively with junctions having highly hysteretic I-V characteristics. Although the hysteresis can complicate circuit design in that the junction tends to latch and thus has to be reset, it does provide two well-defined logic states. In addition, the hysteresis gives high effective current gain in the switching elements - a small control signal can result in a large output signal. In contrast, the same circuits made with nonhysteretic junctions have greatly reduced gain and ill-defined logic levels.

SUMMARY OF THE INVENTION

We propose positive feedback techniques which allow the successful use of nonhysteretic junctions in logic circuitry and eliminate the resetting now required for most hysteretic junction circuits. In accordance with an illustrative embodiment of our invention, a current-steering superconductive circuit includes a circuit node, an output branch connected to the node, a second branch including a nonhysteretic Josephson gate also connected to the node, control means for switching the gate between its zero-voltage, low impedance state and its finite-voltage, higher impedance state, characterized by coupling means which renders the state of the gate also responsive to the current in the output branch. In a preferred embodiment, the magnetic field generated by the output current is coupled to the gate so as to depress its critical current, thereby reducing the amount of control current required to change the critical current and increasing the current gain. In other embodiments, a portion of the output current is added directly to the control current or is injected directly into the gate.

BRIEF DESCRIPTION OF THE DRAWINGS

Our invention, together with its various features and advantages, can be readily understood from the following more detailed description taken in conjunction with the accompanying drawings, in which.

DETAILED DESCRIPTION

General Considerations

Figure 1:
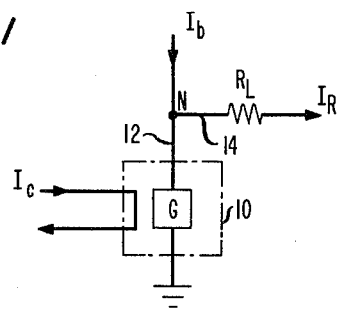
FIG. 1 is a circuit schematic of a prior art Josephson junction gate configuration.
Figure 2:
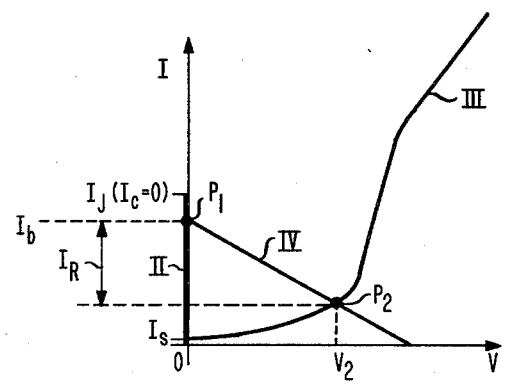
FIG. 2 is a typical I-V characteristic of a hysteretic gate.
Figure 3:
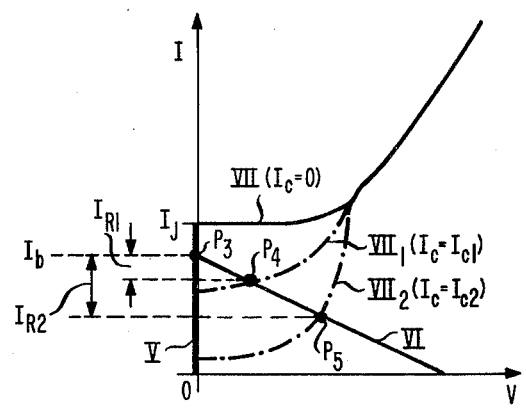
FIG. 3 is a typical I-V characteristic of a nonhysteretic gate.

Before discussing our invention in detail, it will be instructive to consider first the operation of a prior art Josephson junction gate (FIG. 1) in conjunction with the I-V characteristics depicted in FIGS. 2 and 3.

First of all, each of the circuits to be described is in practice maintained within a cryogenically cooled environment well known in the art in order to reduce the temperature below the superconducting transition temperature of the superconductors used to form the circuits. Secondly, each of the circuits is in practice typically fabricated on, but insulated from, a superconducting ground plane. The thickness of the insulator between the ground plane and the circuit elements can be used, in conjunction with the thickness and length of the elements, to control the inductances of the circuit branches. Alternatively, the ground plane may be patterned with apertures to control the inductances. Third, in the drawing discrete inductors are depicted for the purpose of explanation only. These inductors actually represent the distributed self-inductance or mutual inductance of the superconductive conductors or strip lines. All such conductors have some inductance, but inductors are shown only where helpful to the discussion. No lumped-circuit inductors are actually utilized. The conductors, of course, also possess distributed capacitance and hence may be viewed as transmission lines. In cases where the transmission line characteristic impedance is large compared to circuit resistance, only the inductances of the conductors need be considered in describing circuit operation. Fourth, the drawing also depicts discrete resistors which are formed by inserting segments of normal metals or nonsuperconductors in the otherwise superconducting circuit paths.

With reference now to FIG. 1, a typical Josephson junction circuit performs basically a current steering function in response to a control current $I_c$. That is, bias current $I_b$ flows from a current source (not shown) to a circuit node N and from that point flows either to ground through circuit branch 12 which includes a Josephson junction gate G or to a load (represented by resistor $R_L$) through an output circuit branch 14. To which of these two branches the bias current is diverted depends on the state of gate G which in turn is responsive to current $I_c$.

If gate G is hysteretic, its I-V characteristic is represented, as shown in FIG. 2, by supercurrent flow at zero voltage (line II) up to a critical maximum current $I_J$ ($I_c=0$), and single particle tunneling current at finite voltages (curve III). Line IV is a load line for bias current $I_b$ and load resistance $R_L$. Thus, when no control current is present, gate G is in its zero-voltage, zero-impedance state represented by point P1 of FIG. 2, and the bias current flows through branch 12 to ground. When a suitable control current is applied so that $I_J(I_c) < I_b$, gate G switches to its finite-voltage, higher impedance state represented by point P2 of FIG. 2, and the bias current is diverted to the output branch 14. The gate in this state has a voltage drop across it of $V_2 \approx 2\Delta$, where $2\Delta$ is the superconducting gap voltage. Because the gate will remain in state P2 until its current is reduced below the switch-back current $I_s$ (e.g., by temporarily interrupting the bias current), the gate is said to be latched.

The manner in which the gate G is responsive to the control current $I_c$ is depicted generally by influence means 10. In one configuration, means 10 might simply be a conductor which overlays, and is insulated from, the gate or some portion of it, so as to generate a magnetic field which penetrates one or more junctions of the gate or penetrates one or more superconducting loops which contain the junctions of the gate. It is well known that such a field will depress the critical current $I_J$ of a Josephson junction. If $I_J$ is depressed below $I_b$, the junction and hence the gate will switch to state P2. See U.S. Pat. No. 3,281,609 granted to J. M. Rowell on Oct. 25, 1966, for a magnetically controlled single Josephson junction. Another magnetically controlled Josephson gate is the well-known interferometer which basically includes two or more Josephson junctions in parallel. Alternatively, means 10 might be a scheme for adding some or all of the control current to the gate so that the sum of the bias current and added current in the gate exceed $I_J$, thus switching it to state P2. The added control current may be magnetically coupled into the gate, as in the "goalpost" circuit described by T. A. Fulton in U.S. Pat. No. 4,051,393 issued on Sept. 27, 1977, or it may be directly added to the gate, as in the JAWS and HUFFLE circuits also described by T. A. Fulton in U.S. Pat. No. 4,275,314 issued June 23, 1981 and Ser. No. 974,376 filed Dec. 29, 1978, now abandoned in favor of continuation application Ser. No. 232,011 filed on Feb. 6, 1981.

On the other hand, if the gate G is nonhysteretic, its I-V characteristic can be represented by FIG. 3. It also has a region (line V) of supercurrent flow at zero voltage and a load line (line VI) for bias current $I_b$ and load resistance $R_L$. But, the finite-voltage tunneling curve VII is nonhysteretic. When a control current $I_{c1}$ reduces $I_J$ below $I_b$ (see curve VII$_1$), the operating point switches along load line VI from P3 to P4 and current $I_{R1}$ is diverted to output branch 14. A larger control current $I_{c2}$ can depress $I_J$ even further (see curve VII$_2$) causing the operating point to be P5 and $I_{R2}$ to be diverted to the output.

Figure 4:
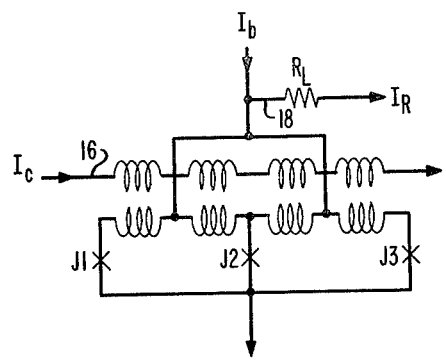
FIG. 4 is a circuit schematic of a prior art three-junction interferometer.

For purposes of exposition only, we will now apply the foregoing more specially to a common basic gate for hysteretic Josephson junction circuits, an interferometer, as shown in FIG. 4, which includes three junctions J1, J2, and J3 connected in parallel. The junctions have maximum critical currents of $I_0$, $2I_0$, $I_0$, respectively, and single ring inductances of L. A bias current $I_b$ is fed into the circuit and a control line 16 couples current into the interferometer. If the coupling constant between the control line and the interferometer loops is $k_c$, then a control current of $I_c$ in the control line induces a current of $k_c I_c$ in the interferometer. The presence of the control current modulates the maximum zero-voltage current, $I_J$, that can pass through the interferometer. If $I_b$ is less than $I_J$, the interferometer remains in the zero-voltage state. If a control current reduces $I_J$ to less than $I_b$, the interferometer switches along a load line to finite voltage as shown in FIG. 2. Current $I_R$ is then steered into the output line 18 of impedance $R_L$.

The value of $I_R$ depends upon the shape of the interferometer I-V characteristic, and the values of $I_b$ and $R_L$. We denote the maximum possible output current as $I^*_R$, and we define the output efficiency $\alpha$ by $$\alpha = I_R/I^*_R. \tag{1}$$

As $R_L$ approaches 0, $\alpha$ approaches 1. (In our analysis, we will assume that $\alpha$ is a constant independent of $I_J$.) The gain of the interferometer is defined as the derivative ratio $dI_R/dI_c$. The gain of a three-junction interferometer can be larger than 1. In fact, in a hysteretic circuit, $I_b$ can be set just below $I_J(I_c=0)$. When $I_c$ is increased slightly, $I_J$ is reduced below $I_b$ and the interferometer latches into the finite-voltage state, transferring most of $I_b$ into the output line, giving very high gain.

For an interferometer made with nonhysteretic junctions, however, the gain is much less. A possible I-V characteristic for such a circuit is shown in FIG. 3. We show a load line for an output line impedance $R_L$, and a bias current $I_b$ less than $I_J(I_c=0)$. Under these conditions, when $I_c=0$ the circuit operates at point P3 and $V=I_R=0$. If $I_c$ were increased to some value, say $I_{c1}$, the circuit would operate at point P4, with about ¼ of $I_b$ transferred as output current $I_R$. If $I_c$ were increased to some value $I_{c2}$ where $I_J$ is a minimum, a maximum current of about ¾ of $I_b$ would be transferred to the output. Notice that the output current $I_R$ is less than or at most equal to $I_b - I_J$:

$$I_R = \alpha I^*_R = \alpha(I_b - I_J). \tag{2}$$

The maximum gain is thus $-dI_J/dI_c$. In a three-junction interferometer, the gain can still be larger than 1, but it cannot approach the large values possible with hysteretic junctions.

Another problem encountered when nonhysteretic interferometers are used in logic circuits is that $I_J(I_c)$ is a smoothly varying function, so that the output current, $I_R$, also has a continuous range of values. It would be advantageous, however, for $I_R(I_c)$ to approximate a step function as it does with hysteretic interferometers.

Feedback Enhanced Circuits

Figure 5:
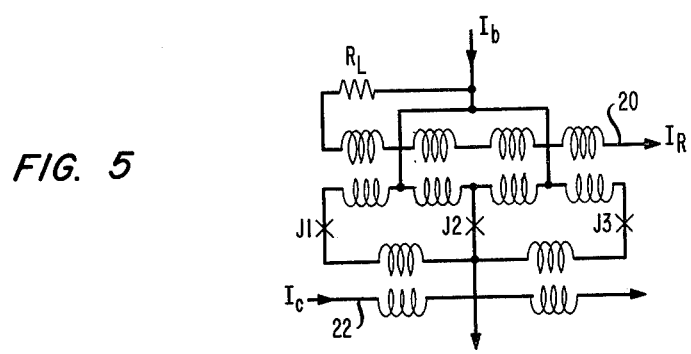
FIG. 5 is a circuit schematic of an illustrative embodiment of our invention as applied to an interferometer of the type depicted in FIG. 4.

In accordance with one aspect of our invention, we propose positive feedback through a control line as a means of sharpening the interferometer response of circuits using nonhysteretic junctions. As shown in FIG. 5, the interferometer configuration of parallel junctions J1, J2, and J3 is the same as in FIG. 4, but in accordance with one embodiment of our invention, the output branch 20 is made to lie near the interferometer loops so that, through magnetic field coupling, the output current $I_R$ induces a current in the interferometer and thereby reduces the amount of control current required for a given reduction of $I_J$. For clarity of illustration, the control line 22 has been drawn below the interferometer and the output line 20 on the top, but there may be actual advantages in topologically separating the control and output lines in the circuit layout; e.g., to avoid having the bias current source interfere with the control current source (which is typically another interferometer circuit in a logic chain).

Our control-line positive feedback approach has several advantages over feedback induced by asymmetric bias current feed interferometer arrangements suggested by J. Clarke et al., *Applied Physics Letters*, vol. 19, page 469 (1971). First, step-function response can be obtained with small inductances in all interferometer arms, an aid in suppressing unwanted LC resonances. Second, our control-line feedback permits the introduction of controlled hysteresis to improve circuit noise immunity. Third, maximum supercurrent through the interferometer coincides with zero-control current.

We have performed a number of calculations which determine the dependence of $I_R(I_c)$ on bias current, $I_b$, and feedback, $\beta$, for control-line feedback circuits. The output current, $I_R$, is given by $$I_R(I_c) = \alpha(I_b - I_f(I^*_c)), \tag{3}$$

where $$I^*_c = k_c I_c + k_f I_f, \tag{4}$$

and $k_f$ is the coupling of the feedback current $I_f$ to the interferometer. We define the feedback, $\beta$, as the ratio of the current coupled into the interferometer by $I_f$ to the output current, $I_R$:

$$\beta = k_f I_f / I_R = k_f I_f / \alpha I^*_R. \tag{5}$$

Figure 9:
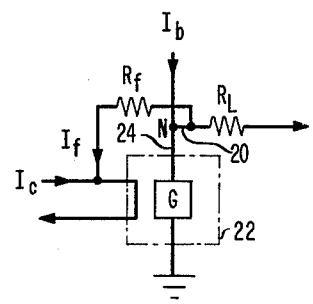
FIG. 9 is a circuit schematic of another embodiment of our invention in which a portion of the output current is added directly to the control current.
Figure 10:
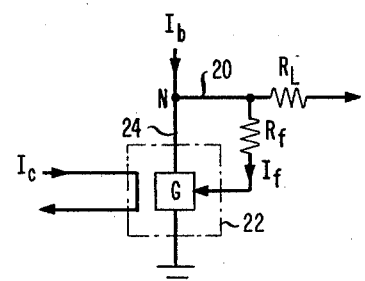
FIG. 10 is a circuit schematic of still another embodiment of our invention in which a portion of the output current is injected directly into the gate.

For the example of a feedback circuit shown in FIG. 5 $I_f = I_R$, but this equality need not hold in other configurations as will be discussed with reference to FIGS. 8-10. Numerical methods were used to determine $I_R(I_c)$ from the above equations. The product $\alpha\beta$ was used as a feedback parameter since it provides curves which are independent of both the details of junction I-V characteristics and the choice of load resistors.

Figure 6:
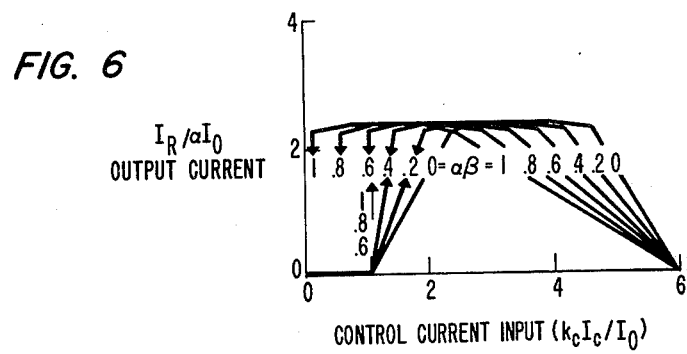
FIG. 6 shows a transfer characteristic (output current vs. control current) generated by computer simulation for the case of $I=0.8\ I_J(I_c=0)$ and different amounts of feedback in the circuit of FIG. 5, where $I_J$ is the critical Josephson current which is a function of the control current $I_c$.
Figure 7:
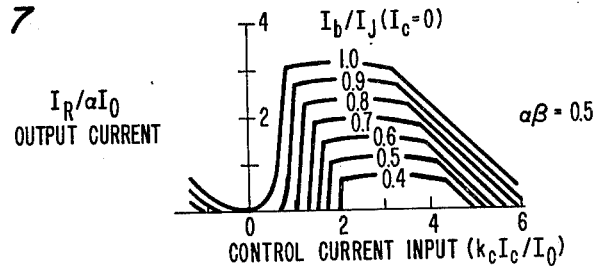
FIG. 7 shows the transfer characteristic for the circuit of FIG. 5 with the amount of feedback fixed and different bias currents.

FIG. 6 shows the effect of increasing feedback for $I_b = 0.8 I_f(I_c = 0)$. As $\beta$ is increased with fixed $\alpha$, the curves sharpen and eventually become hysteretic at $\alpha\beta \geq 0.6$. For a fairly wide range of values of $\beta$, the hysteresis is not too large and should not present a problem for circuit operation. FIG. 7 shows plots of $I_R/\alpha I_0$ for $\alpha\beta$ fixed at 0.5 and $I_b$ varied from $0.4 \times (4I_0)$ to $1.0 \times (4I_0)$, where $LI_0 = \phi_0/7$ and $\phi_0$ is the flux quantum for the interferometer of FIG. 5.

We can look at an example to determine a representative range of bias currents and control currents which allow circuit operation as either an "OR" gate or as an "AND" gate. Consider an interferometer configured as a gate with two control lines, one for input and one for the feedback current. Output current is fed entirely into the feedback control line, and then serially into the control lines of other interferometers, so that $I_R = I_f$. For simplicity, we consider the case where two input currents, $I_{a0}$ and $I_{a1}$, are summed to give the control current, $I_c$, which is passed through the single control line 22 shown in FIG. 5. We define a "0" state in $I_{a0}$ or $I_{a1}$ as zero current, and a "1" state as a current $I_1$. In our example, we will assume that $k_c = k_f = \alpha = 0.7$. Using these values and equation 5, we find that $\alpha\beta = 0.5$. We will now use FIG. 7 to determine the appropriate values of bias current, $I_b/I_f(I_c = 0)$, and logic level, $I_1$, for both "OR" and "AND" operation.

For this circuit to operate as an "OR" gate, the output current, $I_R$, must be greater than $I_1$ when either $I_{a0}$ or $I_{a1}$ equals $I_1$. The output current must be zero when both $I_{a0}$ and $I_{a1}$ are zero. The condition for a "1" output can be expressed by the inequality $I_R/\alpha I_0 > 2k_c I_1/I_0$.

From FIG. 7, this condition is satisfied for a range of values from $$I_b/I_f(0) = 1 \text{ and } k_c I_1/I_0 = 0.85 \tag{6}$$

to $$I_b/I_f(0) = 0.85 \text{ and } k_c I_1/I_0 = 1.3. \text{ ps}$$

For "AND" gate operation, the output must be zero unless both $I_{a0}$ and $I_{a1}$ have values of $I_1$. The condition for the "1" state becomes $2k_c I_1/I_0 > I_R/\alpha I_0 > k_c I_1/I_0$ when $I_c = 2I_1$. This is satisfied over the range $$I_b/I_f(0) = 0.85 \text{ and } k_c I_1/I_0 = 0.6 \tag{7}$$

to $$I_b/I_f(0) = 0.65 \text{ and } k_c I_1/I_0 = 0.8.$$

For both "AND" and "OR" operation, the acceptable range of $I_b$ could be increased by adding a bias to the control current or by allowing nonzero output current for the "0" logic level.

Parallel fanout is possible if we have good fabrication control of junction critical currents. In this case, we could run a d.c. current, $I_c^{d.c.}$, through the control line and set $I_b$ just below $I_f(k_c I_c^{d.c.})$. Then a small increment in $I_c$ would switch the interferometer into the finite-voltage state. For example, consider the circuit shown in FIG. 5 with $k_c = k_f = \alpha = 0.7$, so $\alpha\beta = 0.5$. If the maximum variation in the critical current can be held to below about 5 percent, then, when we bias near $I_b = 0.9 \cdot (4I_0)$ and have $k_c I_c^{d.c.} = 0.7 I_0$, we can switch the interferometer with an input control current of only $0.35 I_0/k_c = 0.5 I_0$. From FIG. 7, we see that switching gives us an output current of $I_R = \alpha I^*_R = 2.6 \times 0.7 = 1.8 I_0$. Thus, in this example, a parallel fanout of three is possible.

These examples illustrate how our feedback scheme can be used to design Josephson logic gates with good switching behavior, free from resetting requirements.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the basic configuration of our circuit is shown schematically in FIG. 8 which is identical with FIG. 1 but for the important provision of positive feedback effected by coupling the output branch 20 to the gate G via influence means 22. However, second branch 24, including gate G, is still connected between node N and ground. As described with reference to influence means 10 of FIG. 1, means 22 may involve overlaying gate G with a portion of the output branch 20 so that the magnetic field associated with the output current $I_R$ induces a current in the gate. The induced current and control current $I_c$ then cooperate to control the state of the gate. Because of the induced current, less control current $I_c$ has to be provided for a given output current, thus increasing gain and sharpening the response characteristic. Note also that for simplicity a single dotted-line box is used to depict influence means for both $I_c$ and $I_R$ but is not intended to exclude separate means for each.

Figure 8:
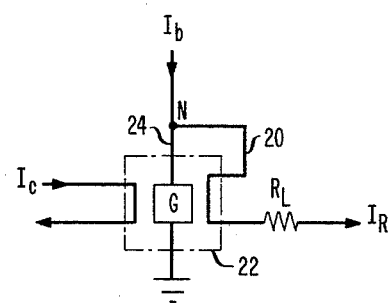
FIG. 8 is a generalized circuit schematic depicting the feedback concepts of our invention.

In the scheme of FIG. 8, in which $I_R$ is only magnetically coupled to the gate, the full output current is supplied to the load. However, in applications where reduced output current can be tolerated, it is possible to tap a portion $I_f$ of the output current and to add it directly to the control current $I_c$ (as in FIG. 9) or to a separate control line (not shown) or to inject it directly into the gate (as in FIG. 10; gate G might be a JAWS circuit, for example). These schemes may not be preferred, however, since they tend to reduce gain as compared to magnetically coupling the output branch to the gate. Moreover, in the configuration of FIG. 9, care should be taken that $I_f$ does not interfere with the source of $I_c$ (often an upstream gate).

We claim:

1. A superconductive circuit comprising
   a circuit node (N) to which bias current ($I_b$) can be applied,
   an output branch (20) connected to said node,
   a second branch (24) connected to said node, said second branch including a nonhysteretic Josephson junction gate (G) having a zero-voltage, low impedance first state below a critical current $I_J$ and finite voltage, higher impedance second state above $I_J$, and
   control means ($I_c$) for switching said gate between its first state in which said bias current flows primarily through said gate and said second state in which said bias current is diverted to said output branch, characterized by
   means (20, 22) for rendering the state of said gate responsive to the flow of output current in said output branch.

2. The circuit of claim 1 wherein said rendering means is further characterized in that the magnetic field associated with said output current is coupled to said gate so as to change its critical current.

3. The circuit of claim 2 wherein said gate includes at least one circuit loop and further characterized in that said output branch is positioned in sufficiently close proximity to said loop that said magnetic field induces a current to flow therein.

4. The circuit of claims 2 or 3 further characterized in that said output branch is positioned sufficiently remote from said control means so that said magnetic field induces an insignificant current therein.

5. The circuit of claim 1 wherein said control means includes a control current line and further characterized in that said rendering means comprises means for adding a portion of said output current to said control line.

6. The circuit of claim 5 further characterized in that said adding means comprises a feedback branch connected between said node and said control line, said feedback branch including a resistor.

7. The circuit of claim 1 wherein said gate is capable of being switched between said states by the injection of current therein and further characterized in that said rendering means comprises means for injecting a portion of said output current directly into said gate.

8. The circuit of claim 7 further characterized in that said injecting means comprises a feedback branch connected between said node and said gate, said feedback branch including a resistor.

* * * * *